United States Patent [19]
Ahlgren

[11] 3,937,932
[45] Feb. 10, 1976

[54] DIGITAL FREQUENCY GENERATOR

[75] Inventor: Joseph R. Ahlgren, Rockford, Ill.

[73] Assignee: Barber-Colman Company, Rockford, Ill.

[22] Filed: Apr. 15, 1974

[21] Appl. No.: 461,094

[52] U.S. Cl..... 235/92 PE; 235/92 DM; 235/92 DL; 235/92 CA; 235/92 R; 328/48
[51] Int. Cl.² ......................................... H03K 21/36
[58] Field of Search...... 235/92 DM, 92 DE, 92 PE, 235/92 CA, 92 PL, 92 CM; 328/48

[56] References Cited
UNITED STATES PATENTS

| | | | |
|---|---|---|---|
| 3,278,727 | 10/1966 | Geis | 235/92 PE |
| 3,581,066 | 5/1971 | Maure et al. | 235/92 PE |
| 3,614,631 | 10/1971 | Bevier | 235/92 PL |
| 3,824,379 | 7/1974 | Noriotomisawa et al. | 235/92 PE |
| 3,840,174 | 10/1974 | Craft | 328/48 X |
| 3,840,724 | 10/1974 | Tripp | 235/92 PL |

*Primary Examiner*—Joseph M. Thesz, Jr.
*Attorney, Agent, or Firm*—McDougall, Hersh & Scott

[57] ABSTRACT

A digital frequency generator for producing a pulse output at a specified frequency is disclosed. The circuit is designed to operate in either of two modes in order to obtain high accuracy over a wide range of frequency operation. In a first mode, the circuit merely acts as a frequency scaler producing an output when a counter overflows. In a second mode, a comparator is employed for deciding whether an additional clock pulse delay is necessary to obtain the required degree of accuracy.

6 Claims, 1 Drawing Figure

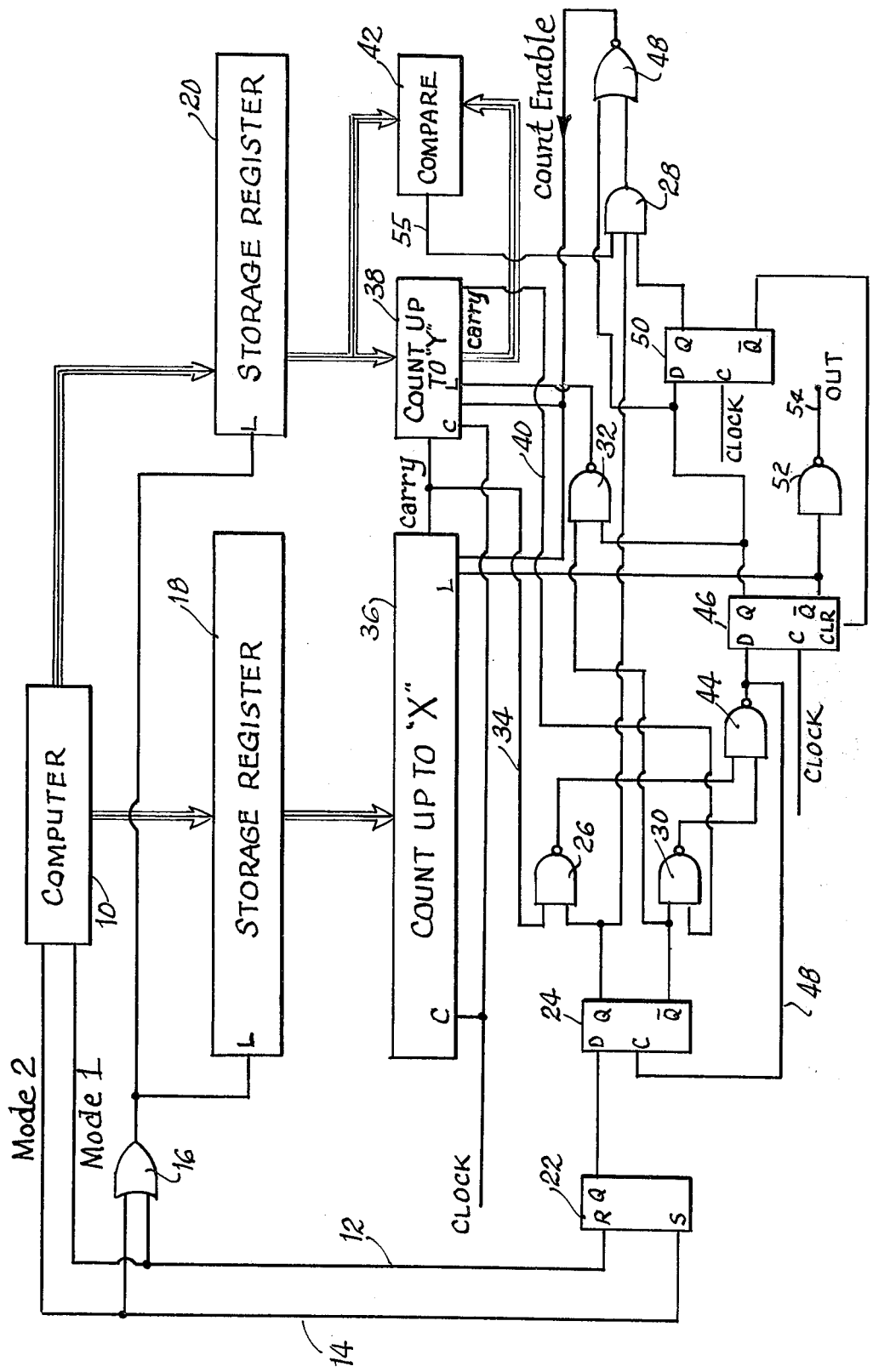

DIGITAL FREQUENCY GENERATOR

BACKGROUND OF THE INVENTION

This invention relates to the field of selectable frequency generators. In particular, the invention relates to a circuit for producing pulses which simulate an engine. The output pulses may be used for calibrating control devices for such engine. For such applications the circuit output must be settable from frequencies on the order of 20 Hz to frequencies in excess of 10 KHz. When it is employed as a calibration unit, the frequency produced is desirably accurate to within 0.1%. To obtain this degree of accuracy requires that the circuit be capable of calibration in steps of 0.025%.

Given the above requirements, namely a digital frequency generator which is capable of producing frequencies up to 10 KHz and is settable to within 0.025% accuracy, a base frequency on the order of 40 MHz would be required if straight frequency scaling were employed. A base frequency of that magnitude, while attainable, is not practicable and would require an inordinate amount of expensive logic to implement.

A technique which produces the required degree of accuracy but avoids the problem of a very high base frequency is to provide the required degree of accuracy over a period of time. That is, short term accuracy (on the order of a few milliseconds) which could be obtained using a 40 MHz base frequency is traded off for long-term accuracy. The average output is made accurate to the required degree by increasing the periods of a certain fraction of the output pulses by one clock cycle. Where this "extended division" technique is used, a base frequency on the order of 2 MHz is sufficient.

For frequencies below approximately 500 Hz, the above "extended division" technique is not required. Accordingly, the present invention which is capable of the desired frequency range and accuracy has two modes of operation, one for producing output pulses in a first low frequency range by straight frequency division techniques and in a higher frequency range utilizing the extended division techniques.

It is accordingly an object of the present invention to provide a frequency generator which is capable of producing a pulse frequency output which is highly accurate.

It is another object of the present invention to provide a circuit capable of operating in either of two modes depending upon the desired frequency output.

It is a further object of the present invention to provide a computer controlled digital frequency generator capable of producing an output dependent upon the information received from the controlling computer.

It is a still further object of the present invention to provide a frequency generating circuit capable of producing a highly accurate output by comparing its operation rate against the selected rate and correcting for differences exceeding a threshold magnitude.

Other objects and advantages of the invention will become apparent from the remaining portion of the specification.

BRIEF DESCRIPTION OF THE FIGURE

The FIGURE is a block diagram of the circuit according to the present invention.

DETAILED DESCRIPTION

As shown in the FIGURE, the circuit according to the present invention receives data input from a computer 10. The computer forms no part of the present invention and may be a general purpose computer of suitable size and speed for the purposes to be described herein. The computer 10 is utilized to select the correct operating mode for the present invention and to provide data input. The mode is selected by applying a positive signal to either of lines 12 or 14. A positive signal on line 12 selects mode 1, the straight frequency division mode, while a positive signal on line 14 selects mode 2, the extended division output.

Selection of the correct mode is determined by the desired output frequency from the circuit. If the desired frequency is 500 Hz or higher, mode 2 is selected. Conversely, if the desired output is approximately 500 Hz or less, mode 1 is selected since extended frequency division is not required to produce an output to the accuracy desired.

A signal is applied to either of lines 12 or 14 and is provided through OR gate 16 effective for loading a pair of storage registers 18 and 20. The storage registers 18 and 20 receive data in parallel on a plurality of data lines from the computer. The storage registers may be of any desired bit capacity although typically register 18 will be larger than register 20.

As thus far described, it will be apparent that the controlling computer determines the desired output frequency and selects the appropriate mode of operation for the circuit shown in the FIGURE. Once the mode has been selected, the computer then enables the registers 18 and 20 so that data may be loaded in parallel from the computer to the registers.

Selection of either mode is effective for setting or resetting an R-S type flip-flop 22. Line 12 is connected to the reset input of flip-flop 22 while line 14 is connected to the set input to flip-flop 22. Thus when line 12 is high, the Q output is low, and conversely, when line 14 is high, the Q output is high. The Q output of flip-flop 22 is applied to D type flip-flop 24.

The Q output of flip-flop 24 is connected as one input to NAND gate 26 and as one of three inputs to AND gate 28. The Q̄ output of flip-flop 24 is provided to NAND gates 30 and 32.

A second input to NAND gate 26 is provided on line 34 from a counter 36. Counter 36, as will be explained, receives the data stored in the register 18 and counts at the clock rate supplied until an overflow or carryout is produced. This carryout is provided on line 34 to NAND gate 26 and is also provided as a carry in to a second counter 38. In a similar manner the counter 38 in mode 1 receives data from register 20 and counts until a carryout is produced on line 40 which is the second input to NAND gate 30. In the extended division mode (mode 2) the counter 38 does not receive the data from register 20. Instead, it is utilized by comparator 42 in a manner to be explained.

The outputs from NAND gates 26 and 30 constitute the inputs to NAND gate 44. Gate 44 controls D type flip-flop 46 and is also utilized to clock flip-flop 24 via line 48. Flip-flop 46 and counters 36 and 38 receive the base frequency clock signal which, as previously stated, is preferably on the order of 2 to 3 MHz.

The Q output of flip-flop 46 is provided as the second input to NAND gate 32, as one input to NOR gate 48 and to flip-flop 50. The Q̄ output of flip-flop 46 is applied to counter 36 and prevents loading when the $\overline{Q}$ is high. In a similar manner, a high output from NAND gate 32 prevents loading of counter 38.

The Q output of flip-flop 50 is provided as a second input to AND gate 28, whose output is provided as the second input to NOR gate 48. The output of NOR gate 48 starts and stops the counters 36 and 38. When the output of NOR gate 48 is high, the counters are enabled and count the base frequency clock pulses. When the output of NOR gate 48 is low, the counters are inhibited from counting.

Provided as a third input to the AND gate 28 is the output from the comparator 42. The comparator 42 is utilized only in mode 2, the extended division mode. When utilized, the comparator compares the count in counter 38 against the binary number stored in the register 20. The comparator produces a high input to the AND gate 28 if the value of the register 20 is less than or equal to the value of the counter 38. As will be explained, this is effective for producing a one clock pulse delay before counting is resumed.

The output of the circuit is taken via a buffering NAND gate 52 on line 54. It will be apparent that the buffered output received on line 54 can be further processed or shaped as desired, such subsequent signal processing forming no part of the present invention.

OPERATION

In order to describe the operation of the present invention, it will be convenient to consider each mode of operation separately. For purposes of explanation, it will be assumed that the computer 10 has determined the required frequency of the output pulses on line 54. As a first example, it will be assumed that a 100 Hz output is desired. In that case, the computer will select mode 1 operation by producing a high output on line 12.

Energizing line 12 initiates loading of the registers 18 and 20 which receive data by parallel data transfer from the computer 10. The data received from the computer is a binary number calculated by an algorithm as the proper starting point for the counters so as to require the counters 36 and 38 to count for a predetermined number of clock pulses before producing an output on line 54. By increasing or decreasing the binary numbers stored in the registers 18 and 20, the frequency of the output can be varied as desired.

As an example, if the clock frequency is 2 MHz and the output frequency desired on line 54 is 100 Hz, then for counters of a known bit length, such as 8, 12 or 16 bits, it is easily computed how many clock pulses the counters must count between output pulses to yield the desired frequency. The computer is utilized to calculate the required number of clock pulses and to transfer into the storage registers 18 and 20 a binary number which will preset the starting value of the counters. After the appropriate number of clock cycles, the desired output pulse is produced when the counters overflow.

Continuing with the 100 Hz output example, the computer selects mode 1 for the circuit of the present invention, and computes the two binary numbers to be loaded into the registers 18 and 20. In mode 1 the logic states of flip-flop 46 and gate 32, which control loading of the counters 36, 38, are such as to load the numbers from the registers 18 and 20 into the counters 36 and 38 respectively. Counting then begins. In mode 1, the carryout signal (line 40) from counter 38 is utilized for initiating an output pulse on line 54 by changing the state of gate 44. Conversely, in mode 2 operation, the carryout signal on line 34 to gate 26 is effective for changing the state of gate 44.

Thus, in mode 1, the counters 36 and 38 are utilized as one long counter rather than two separate discrete counters. The carryout signal on line 34 in mode 1 is only utilized to increment the counter 38 and does not affect the circuit logic.

The carryout signal is effective for causing NAND gate 44 to go high. When gate 44 goes high, it sets flip-flop 46 producing a low signal as an input to gate 52. In turn this produces the output pulse on line 54.

Simultaneously with producing the output pulse, the next binary numbers are loaded. This is accomplished by the Q output of flip-flop 46 going high, causing NAND gate 32 to go low, enabling loading of counter 38. In the same manner the $\overline{Q}$ output from flip-flop 46 enables counter 36 to be loaded.

When flip-flop 46 changes state due to the occurrence of a carryout signal, it also applies a high input to the NOR gate 48, to inhibit counting. The counters 36 and 38 remain off while new binary numbers are loaded for a period of one clock cycle as will now be explained. When the counting stops it is due to the high input to NOR gate 48 from flip-flop 46. This high output is also applied to flip-flop 50 for resetting the circuit. The $\overline{Q}$ output of flip-flop 50 resets flip-flop 46 after one clock pulse. Resetting flip-flop 46 produces a low Q output producing a high output from NOR gate 48 for starting the counters.

As will be observed, in mode 1, the comparator 42 is not utilized. In brief, in mode 1 the circuit receives in parallel two binary numbers one for each of the counters 36 and 38. The counters then begin to count starting from the number supplied until a carryout signal is produced on line 40. This carryout is effective for causing flip-flop 46 to change state and in turn produce the desired output on line 54. Simultaneously the circuit loads a new binary number into the counters and begins counting at the next clock pulse.

It will be apparent that the number loaded into the counters need not change with every counting cycle. That is, for a constant frequency output the same number will be repetitively loaded from the storage registers 18 and 20 into the counters 36 and 38, respectively. As an example only, if counters 36 and 38 are $x$ and $y$ bit binary counters, respectively, the base clock frequency is 2 MHz and the desired output frequency is 100 Hz, then the counter capacity $= 2^{x+y}$. Dividing the base clock frequency by the desired output frequency 2 MHz/100 Hz = 20,000. Thus every 20 K clock pulses an output is required. Thus the number loaded into the counter is $2^{x+y} - 20,000$.

MODE 2

In mode 2, the extended division mode, the operation of the circuit is somewhat different. In this mode, a portion of the binary number is loaded from the register 18 into the counter 36. However, the number in the register 20 is provided to the comparator 42 instead of counter 38. Depending upon the results of a comparison between the number in register 20 and the value of the counter 38, the circuit may remain off for one additional clock pulse in addition to the loading time. This additional delay is effective for obtaining, over a period of time, the desired accuracy from the circuit.

When mode 2 is selected, data is again loaded from the computer to the registers 18 and 20. The Q output of flip-flop 22 is now high. In turn, NAND gate 26 is high, setting this gate to receive the carryout on line 34 from counter 36 for operating flip-flop 46 to produce the output pulse on line 54. Thus, when counter 36 overflows an output is produced. In mode 2 it is desired that the counter 38 not receive a binary number from the register 20. To inhibit this data transfer, NAND gate 32 is connected to the $\bar{Q}$ output of flip-flop 24 which will keep gate 32 high as long as the circuit is in mode 2. It will be recalled that a high output on gate 32 inhibits loading of the counter 38.

As in mode 1, after a binary number has been loaded into the counter 36, counting begins and continues until a carryout is produced. This produces the desired output on line 54. The corresponding high output on the Q terminal of flip-flop 46, as in the mode 1 operation, is effective for operating flip-flop 50 and NOR gate 48. As in mode 1, when a high input is provided to NOR gate 48, the counter 36 is stopped for one clock pulse until the flip-flop 50 resets counter 46 to initiate counting for the next cycle. The difference in mode 2 is that the digital logic associated with comparator 42 and AND gate 28 provide a mechanism whereby the circuit may be made to remain off for an additional clock pulse if the results of a comparison in comparator 42 indicate a necessity for so doing.

The decision as to whether or not the counter 36 will remain off for one or two clock pulses is determined by the three-input AND gate 28 which is controlled by the comparator 42. AND gate 28 is capable of being operated only in mode 2 since its middle input is connected to the Q output of flip-flop 24 which is high only in mode 2. The bottom input to the AND gate 28 is from the Q output of flip-flop 50, and this output is high only for the clock pulse immediately following a carryout on line 34. Thus, immediately following a carryout, in mode 2, if the input to gate 28 from the comparator is high, the gate produces a high output to NOR gate 48 effective for disabling counting by keeping the NOR gate 48 off.

Thus, it will be apparent that should the comparator signal be high, the sequence of operation is as follows: An output is produced by the counter 38, causing flip-flop 46 to change state. This produces the digital output and stops the counter 36 since the upper input to NOR gate 48 goes high. When this happens in mode 2, AND gate 28 also becomes enabled. Subsequently the circuit is reset by flip-flop 50 causing the upper input to NOR gate 48 to go low again; however, the lower input to NOR gate 48 remains high for one additional clock pulse, thereby continuing to disable counter 36 for an additional clock pulse. After the second clock pulse, the flip-flop 50 is itself reset so that its Q output goes low and the AND gate 28 is disabled. This in turn restores a high output from NOR gate 48 permitting counting to resume.

Whether or not the input from the comparator to AND gate 28 is high is dependent upon the results of a comparison between the value in the counter 38 and the number stored in register 20. As previously stated, even though the counter 38 is not utilized for producing a carry output in mode 2, it does receive the carryout from the counter 36 and thus continues to function as a counter. The value in the counter 38 at any given time is provided via a plurality of data lines to the comparator 42. The comparator repetitively compares the bits of the number in the counter 38 against the number from the register 20. If the number stored in the register 20 is less than or equal to the number which the counter 38 has counted up to, a high output is produced on line 55 and applied to the AND gate 28 for the purposes previously described. As will be explained, when the inequality just mentioned is true, it is an indication that the output on line 54 is at a frequency slightly greater than the desired frequency, and that in order to obtain the desired accuracy over the desired period, a one-pulse clock delay is necessary.

To understand this, recall that the computer calculates the number of clock pulses between an output pulse necessary to produce a selected frequency. It may occur that the number of pulses is fractional. That is, the selected frequency requires a fractional number of clock pulses to produce the desired output frequency. In mode 2, the counters are utilized such that counter 36 receives the whole number of cycles and register 20 is given a number representing the fractional number of cycles to produce a desired output frequency.

As an illustrative example only, assume that the correct number of clock pulses to produce a desired frequency is 2098.5. In that case, a binary number ($2^x -$ [Base freq./Desired freq.]) is loaded into register 18 and used to preset counter 36 for overflow after 2098 cycles. A binary number corresponding to the fractional cycle is loaded into the register 20. If the counter 38 count is $y$ bits, the number loaded into register 20 is $2^y/2$ for an extra half cycle. As the counter 38 counts the number of carryouts from the counter 36, the comparator will continually make comparisons producing an output when the value of the counter 38 exceeds the value of the number in register 20. When it does exceed the value in register 20, it is an indication that the output frequency requires a one-clock pulse delay to adjust the frequency to the desired accuracy. Such adjustment will be continually made as long as the inequality stated remains true. In this manner, the desired accuracy over a relatively long period of time compared to a base clock frequency of 2 MHz is obtained.

While I have shown and described an embodiment of this invention in some detail, it will be understood that this description and illustration are offered merely by way of example, and that the invention is to be limited in scope only by the appended claims.

I claim:

1. A two-mode digital pulse generator producing a selectable frequency output determined by a controlling computer, said computer also selecting the mode of operation depending on the selected frequency comprising:
   a. storage means for receiving a multiple bit binary number in parallel from said computer;
   b. means for producing clock pulses;
   c. means for counting said clock pulses and producing a carry signal when counting capacity is exceeded including first and second counters each producing a carry signal when they overflow; the carry signal of the 1st counter incrementing the second counter;
   d. means tranferring said binary number into both of said counters in a first mode and a portion of said number into only the 1st counter in a second mode to preset the initial value at which counting begins;
   e. means responsive to the second counter carry signals in said first mode and to the first counter carry signals in said second mode for producing said output pulses at the selected frequency;

f. comparison means operative in said second mode for repetitively comparing the value of the second counter against the untransferred protion of said binary number in said storage means to produce an inhibit output indicative of the need for counting inhibition to maintain the selected frequency output;

g. logic means receiving said inhibit output, in the second mode, for inhibiting counting for a predetermined period to effect correction of the output pulse frequency.

2. A digital pulse generator according to claim 1 wherein said receiving means is a pair of parallel storage registers.

3. A digital pulse generator according to claim 2 wherein one of said storage registers is of greater capacity than the other.

4. A digital pulse generator according to claim 1 wherein said clock pulses are produced with a frequency in the range of 1 to 3 MHz.

5. A digital pulse generator according to claim 4 wherein said pulse generator is capable of producing a pulse output over the range of 30 Hz to 10 KHz plus or minus one percent.

6. A digital pulse generator according to claim 1 wherein said means for transferring includes:

a. means for loading said counting means after each output pulse; and
b. means for inhibiting counting during loading.

* * * * *